(12) United States Patent
Lee et al.

(10) Patent No.: US 7,759,783 B2
(45) Date of Patent: Jul. 20, 2010

(54) INTEGRATED CIRCUIT PACKAGE SYSTEM EMPLOYING THIN PROFILE TECHNIQUES

(75) Inventors: Hun Teak Lee, Ichon (KR); Tae Keun Lee, Ichon-si (KR); Soo Jung Park, Yongin-si (KR)

(73) Assignee: Stats Chippac Ltd., Singapore (SG)

( * ) Notice: Subject to any disclaimer, the term of this patent is extended or adjusted under 35 U.S.C. 154(b) by 458 days.

(21) Appl. No.: 11/608,123

(22) Filed: Dec. 7, 2006

(65) Prior Publication Data
US 2008/0137312 A1 Jun. 12, 2008

(51) Int. Cl.
*H01L 23/538* (2006.01)
*H01L 23/02* (2006.01)
*H01L 23/495* (2006.01)
*H01L 23/522* (2006.01)
*H01L 23/52* (2006.01)
*H01L 25/065* (2006.01)
*H01L 23/28* (2006.01)
*H01L 23/31* (2006.01)
*H05K 7/00* (2006.01)

(52) U.S. Cl. ............... 257/686; 257/E23.142; 257/E23.031; 257/E21.502; 257/E25.005; 257/E25.006; 257/E25.021; 257/E25.026; 257/E25.027; 257/E25.013; 257/E23.169; 257/777; 257/723; 257/659; 257/685; 257/676; 257/675; 438/109; 361/735

(58) Field of Classification Search ........... 257/659, 257/686, 685, 777, 675, 676, 723, E23.085, 257/E25.005, E25.006, E25.021, E25.026, 257/E25.027, E25.013, E23.142, E23.169, 257/E21.502; 438/109; 361/735
See application file for complete search history.

(56) References Cited

U.S. PATENT DOCUMENTS

| | | | |
|---|---|---|---|
| 5,757,080 A | 5/1998 | Sota | |
| 6,239,367 B1 | 5/2001 | Hsuan et al. | |
| 6,476,474 B1 | 11/2002 | Hung | |
| 6,590,281 B2 | 7/2003 | Wu et al. | |
| 6,677,674 B2 | 1/2004 | Nagao | |
| 6,724,074 B2 * | 4/2004 | Song et al. | 257/676 |
| 6,759,737 B2 | 7/2004 | Seo et al. | |
| 6,764,880 B2 | 7/2004 | Wu et al. | |
| 6,984,881 B2 | 1/2006 | Takiar | |
| 7,045,396 B2 | 5/2006 | Crowley et al. | |
| 7,078,794 B2 | 7/2006 | Lee | |
| 7,138,704 B2 | 11/2006 | Lien et al. | |
| 7,145,247 B2 | 12/2006 | Kawano et al. | |
| 7,622,333 B2 | 11/2009 | Kim et al. | |
| 7,645,638 B2 | 1/2010 | Kim et al. | |
| 7,683,467 B2 * | 3/2010 | Jang et al. | 257/686 |
| 2001/0053567 A1 * | 12/2001 | Akram et al. | 438/127 |
| 2003/0209740 A1 | 11/2003 | Miyamoto et al. | |
| 2004/0021230 A1 | 2/2004 | Tsai et al. | |
| 2004/0124539 A1 * | 7/2004 | Yang et al. | 257/777 |
| 2005/0156290 A1 | 7/2005 | Lien et al. | |

(Continued)

*Primary Examiner*—Alexander O Williams
(74) *Attorney, Agent, or Firm*—Mikio Ishimaru

(57) ABSTRACT

An integrated circuit package system that includes: providing an electrical interconnect system including a first lead-finger system and a second lead-finger system; stacking a second device over a first device between the first lead-finger system and the second lead-finger system; connecting the second device to the second lead-finger system with a bump bond; stacking a dummy device over the second device; and connecting the first device to the first lead-finger system with a wire bond.

20 Claims, 5 Drawing Sheets

U.S. PATENT DOCUMENTS

| | | |
|---|---|---|
| 2005/0189623 A1 | 9/2005 | Akram et al. |
| 2006/0151865 A1* | 7/2006 | Han et al. .................. 257/686 |
| 2006/0249851 A1* | 11/2006 | Karnezos ................... 257/777 |
| 2007/0117266 A1* | 5/2007 | Ball .......................... 438/108 |
| 2007/0187826 A1* | 8/2007 | Shim et al. ................. 257/738 |
| 2008/0029868 A1 | 2/2008 | Lee et al. |
| 2008/0029905 A1 | 2/2008 | Merilo et al. |
| 2008/0030205 A1* | 2/2008 | Fujii et al. .................. 324/661 |
| 2008/0079130 A1* | 4/2008 | Ha et al. ..................... 257/680 |
| 2008/0135989 A1 | 6/2008 | Jang et al. |
| 2008/0136005 A1* | 6/2008 | Lee et al. .................... 257/686 |
| 2008/0136006 A1* | 6/2008 | Jang et al. ................... 257/686 |
| 2008/0136007 A1* | 6/2008 | Kim et al. ................... 257/686 |
| 2008/0164596 A1* | 7/2008 | Lim ........................... 257/686 |

* cited by examiner

INTEGRATED CIRCUIT PACKAGE SYSTEM EMPLOYING THIN PROFILE TECHNIQUES

CROSS-REFERENCE TO RELATED APPLICATION(S)

The present application contains subject matter related to co-pending U.S. patent application Ser. No. 11/462,568. The related application is assigned to STATS ChipPAC Ltd.

The present application also contains subject matter related to a co-pending U.S. patent application Ser. No. 11/462,588. The related application is assigned to STATS ChipPAC Ltd.

The present application also contains subject matter related to a co-pending U.S. patent application Ser. No. 11/462,607. The related application is assigned to STATS ChipPAC Ltd.

The present application also contains subject matter related to a co-pending U.S. patent application Ser. No. 11/536,502. The related application is assigned to STATS ChipPAC Ltd.

The present application contains subject matter related to co-pending U.S. patent application Ser. No. 11/635,941. The related application is assigned to STATS ChipPAC Ltd.

TECHNICAL FIELD

The present invention relates generally to integrated circuits, and more particularly to an integrated circuit package system employing thin profile techniques.

BACKGROUND ART

Integrated circuits are what power many of today's consumer electronics, for instance, cellphones, video cameras, portable music players, computers, etc. The use of wafers is still the most cost-effective way to fabricate these integrated circuits. But, before these integrated circuits can be incorporated into today's consumer electronics, they must be separated from the wafer and assembled into final integrated circuit packages.

The assembly and packaging portion of the integrated circuit manufacturing process takes these separated integrated circuit devices, places them onto a leadframe, and interconnects the bonding pads of the integrated circuit to the leads of the leadframe via wire-bonding. This combination is then usually encapsulated by a resin compound to protect the integrated circuit package from various conditions, such as moisture, temperature, and mechanical vibration.

Unfortunately many integrated circuit package designs suffer from large footprint areas and die/package warpage. For example, wirebond interconnections formed between the bonding pads of the integrated circuit and the leads of the leadframe require a minimum spacing requirement that adds to the footprint of the integrated circuit package. Additionally, many packages experience die or package warpage as device profiles are reduced to meet customer demand toward smaller consumer electronic devices. The future packaging goals of the electronics industry will be met by decreasing the footprint and packaging profile of each device, while maintaining its structural integrity.

Thus, a need still remains for a reliable integrated circuit package system and method of fabrication, wherein the integrated circuit package system possesses a reduced footprint area and a reduced package profile while maintaining its structural rigidity. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an electrical interconnect system including a first lead-finger system and a second lead-finger system; stacking a second device over a first device between the first lead-finger system and the second lead-finger system; connecting the second device to the second lead-finger system with a bump bond; stacking a dummy device over the second device; and connecting the first device to the first lead-finger system with a wire bond.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
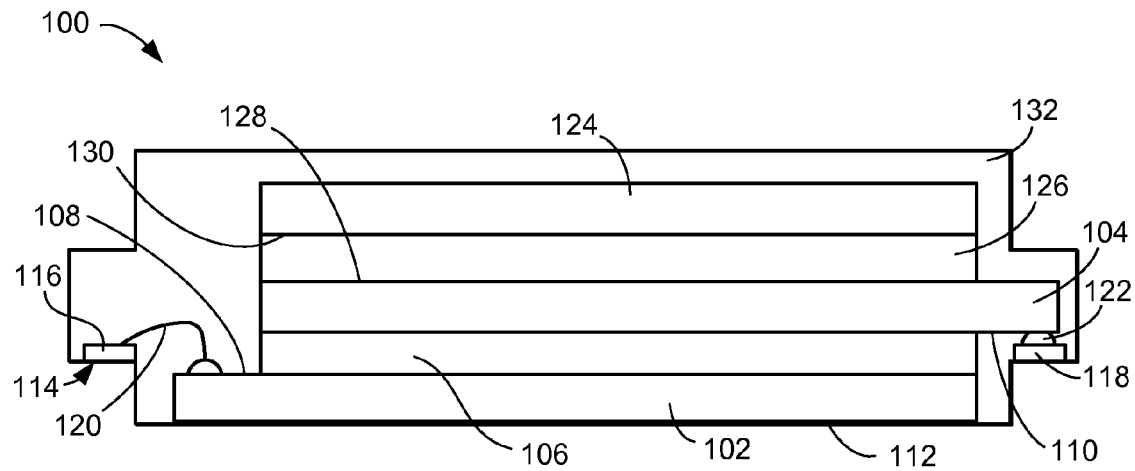
FIG. 1 is a cross sectional view of an integrated circuit package system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the integrated circuit package system, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross sectional view of an integrated circuit package system 100, in accordance with an embodiment of the present invention. The integrated circuit package system 100 includes a first device 102, a second device 104, a first inter-device structure 106, a first device active side 108, a second device active side 110, a first device backside 112, an electrical interconnect system 114, a first lead-finger system 116, a second lead-finger system 118, a wire bond 120, a bump bond 122, a dummy device 124, a second inter-device structure 126, a second device backside 128, a dummy device bottom side 130 and an encapsulation material 132.

By way of example, the first device 102 and the second device 104 are stacked one over the other and may include semiconductor chips and integrated circuit packages selected from active components, passive components, stacked components, memory components, and so forth, in numerous configurations and arrangements as may be needed. It is to be understood that the first device 102 and the second device 104 cover a wide range of semiconductor chip and integrated circuit package configurations involving various sizes, dimensions, and electrical contact techniques, and the type of chip or package configuration employed should only be limited by the design specifications of the integrated circuit package.

The first device 102 and the second device 104 are separated by the first inter-device structure 106, or more specifically, the first device active side 108 and the second device active side 110 are separated by the first inter-device structure 106. The first inter-device structure 106 may include an adhesive with or without thermally conducting capabilities, a spacer, an electromagnetic interference shield for blocking potentially disruptive energy fields, or a combination thereof. For example, if the first inter-device structure 106 is an adhesive layer, the adhesive layer may include a film or a partially unconsolidated (e.g.—a liquid or a gel) adhesive material, which allows the second device 104 to self-align. Furthermore, if the first inter-device structure 106 is an adhesive layer, the adhesive layer can be deposited in any configuration or shape, which facilitates the adhesion of the second device 104.

A notable aspect of the present invention is its improved thermal dissipation ability. The present invention achieves this by exposing the first device backside 112. This improved thermal dissipation ability can be further enhanced by attaching a thermally conductive substrate or a heat sink adjacent the first device backside 112. By improving the ability of the integrated circuit package system 100 to dissipate heat, the reliability and the useful life of the integrated circuit package system 100 can be improved.

Another notable aspect of the present invention is that it allows for testing of the first device 102 and the second device 104 before adhering them to the electrical interconnect system 114, therefore ensuring the use of known good die or packages in the manufacturing process. Additionally, after adhering the first device 102 and the second device 104 to the electrical interconnect system 114, these assemblies can also be tested before incorporation into additional package systems. This ensures that the final product includes known good assemblies, and thereby improves the manufacturing process yield for packaging.

The electrical interconnect system 114 includes the first lead-finger system 116, which can be designed to accommodate bond wires, and the second lead-finger system 118, which can be designed to accommodate bump bonding technology. The first device 102 and the second device 104 are stacked one over the other between the first lead-finger system 116 and the second lead-finger system 118. Notably, the electrical interconnect system 114 does not include a paddle. By eliminating the need for a paddle, the profile of the integrated circuit package system 100 is greatly reduced.

The profile of the integrated circuit package system 100 can be even further reduced by employing thin and ultra-thin devices for the first device 102 and the second device 104. Through the use of thin and ultra-thin devices, the integrated circuit package system 100 may achieve a package height of about 0.20 mm or less, even when employing the same die or two different die for the first device 102 and the second device 104. This reduced profile design of the integrated circuit package system 100 also naturally improves thermal dissipation because the heat flux of a solid object is inversely proportional to the thickness of the object, noting Fourier's law of heat conduction in solids.

By way of example, the electrical interconnect system 114 may include a thin metal sheet, a conductive plated pattern on plastic tape, or any structure suitable for electrically interconnecting the first device 102 and the second device 104 to external electrical circuits. By way of example, the electrical interconnect system 114 may include a structure with dual in-line leads, quad flat pack leads, gull-wing leads, j-leads, leadless leads that wrap around the package edge to maintain a low profile, downset leads, pin leads, and/or ball leads. However, it is to be understood that the present invention is not to be limited to these examples. In accordance with the invention, the electrical interconnect system 114 may include any electrical interconnection structure (i.e.—leads) that facilitates the incorporation of the integrated circuit package system 100 into a higher-level assembly, such as a printed circuit board or other suitable structure for supporting the integrated circuit package system 100.

Additionally, for even greater interconnect density, the present invention may employ single row, dual row and/or half-etched leads or lands.

The present invention incorporates a combination of wire bonding and bump bonding technology, to electrically interconnect the first device 102 and the second device 104 to the electrical interconnect system 114. For illustrative purposes, the first lead-finger system 116 is shown electrically connected to the first device 102 by the wire bond 120, and the second lead-finger system 118 is shown electrically connected to the second device 104 by the bump bond 122. The first lead-finger system 116 and the second lead-finger system 118 may be made from any number of materials that provide an electrically conductive and bondable surface for the wire bond 120 and the bump bond 122. For example, the first lead-finger system 116 and the second lead-finger system 118 may be made from a copper alloy or a nickel/palladium combination.

The present invention is able to employ both wire bonding and bump bonding technology by offsetting the second device 104 from the first device 102 such that the bonding pads on the first device active side 108 and the second device active side 110 are left exposed. By strategically offsetting the second device 104, the bonding pads located on the second device active side 110 can be aligned over the second lead-finger system 118 and bump bonding technology can be employed to electrically interconnect the second device 104 and the second lead-finger system 118.

The bump bond 122 of the present invention simplifies the manufacturing process by eliminating the steps of package inversion and tape removal that is required for conventional wire bonding of the second device 104 to the second lead-finger system 118. Additionally, by employing bump bonding technology, the present embodiment eliminates the minimum spacing requirement of wire bonding technology, thereby reducing the footprint of the integrated circuit package system 100.

For example, a wire bond leadframe lead that is adjacent a device requires a minimum distance to enable a wire bond interconnection between the peripherally located bonding pads of the device and the lead. By contrast, the bump bonding technology employed by the present invention allows the second lead-finger system 118 to be placed underneath the second device 104, instead of adjacent the second device 104. By allowing the displacement of the second lead-finger system 118 under the second device 104, the width of the package is reduced and the overall footprint area of the package is reduced as well.

It will be appreciated by those skilled in the art that the wire bond 120 and the bump bond 122 can be deposited using materials and techniques well known within the art and are not repeated herein.

The dummy device 124 is stacked over the second device 104. The second device 104 and the dummy device 124 are separated by the second inter-device structure 126, or more specifically, the second device backside 128 and the dummy device bottom side 130 are separated by the second inter-device structure 126. The second inter-device structure 126 may include an adhesive with or without thermally conducting capabilities, a spacer, an electromagnetic interference shield for blocking potentially disruptive energy fields, or a combination thereof. For example, if the second inter-device structure 126 is an adhesive layer, the adhesive layer may include a film or a partially unconsolidated (e.g.—a liquid or a gel) adhesive material, which allows the dummy device 124 to self-align. Furthermore, if the second inter-device structure 126 is an adhesive layer, the adhesive layer can be deposited in any configuration or shape, which facilitates the adhesion of the dummy device 124.

By way of example, the dummy device 124 may include an inactive semiconductor die/package, a spacer, a strip level net spacer, an electromagnetic interference shield, a thermally conductive layer, or a combination thereof. However, it is to be understood that the present invention is not to be limited to these examples. In accordance with the invention, the dummy device 124 may include any configuration or material that imparts support and rigidity to the integrated circuit package system 100.

It has been discovered by the present inventors that warpage of the first device 102, the second device 104 and/or warpage of the integrated circuit package system 100, as a whole, can be prevented by forming the dummy device 124 over the second device 104. By forming the dummy device 124 to provide structural support, incidences of delamination, device cracking, and/or warpage are reduced as the profile of the integrated circuit package system 100 is also reduced.

The encapsulation material 132, such as a plastic molding compound, is deposited over the first device 102, the second device 104, the first inter-device structure 106, the electrical interconnect system 114, the wire bond 120, the bump bond 122, the dummy device 124, and the second inter-device structure 126, while leaving exposed the first device backside 112 for thermal dissipation. The encapsulation material 132 not only protects the integrated circuit package system 100 from the external environment but it also provides support and stability. The encapsulation material 132 and molding techniques using it are well known in the art and not repeated herein.

Figure 2:
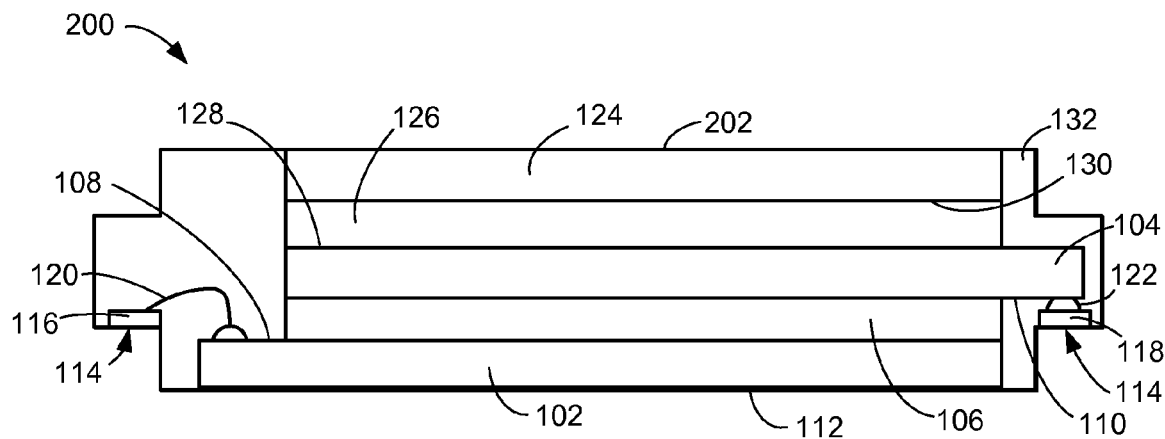
FIG. 2 is a cross sectional view of an integrated circuit package system, in accordance with an embodiment of the present invention.

Referring now to FIG. 2. FIG. 2 depicts a similar configuration as to that shown in FIG. 1, and consequently, only the differences between the figures will be described, to avoid redundancy.

FIG. 2 shows a cross sectional view of an integrated circuit package system 200, in accordance with an embodiment of the present invention. The integrated circuit package system 200 includes the first device 102, the second device 104, the first inter-device structure 106, the first device active side 108, the second device active side 110, the first device backside 112, the electrical interconnect system 114, the first lead-finger system 116, the second lead-finger system 118, the wire bond 120, the bump bond 122, the dummy device 124, the second inter-device structure 126, the second device backside 128, the dummy device bottom side 130, the encapsulation material 132 and a dummy device top side 202.

Notably the present embodiment improves the thermal dissipation ability of the integrated circuit package system 100, of FIG. 1, by exposing the first device backside 112 and the dummy device top side 202 to the external environment. This improved thermal dissipation ability can be further enhanced by attaching a thermally conductive material, such as a heat sink, adjacent the first device backside 112 and/or the dummy device top side 202. By improving the ability of the integrated circuit package system 200 to dissipate heat, the reliability and the useful life of the integrated circuit package system 200 can be improved.

Figure 3:
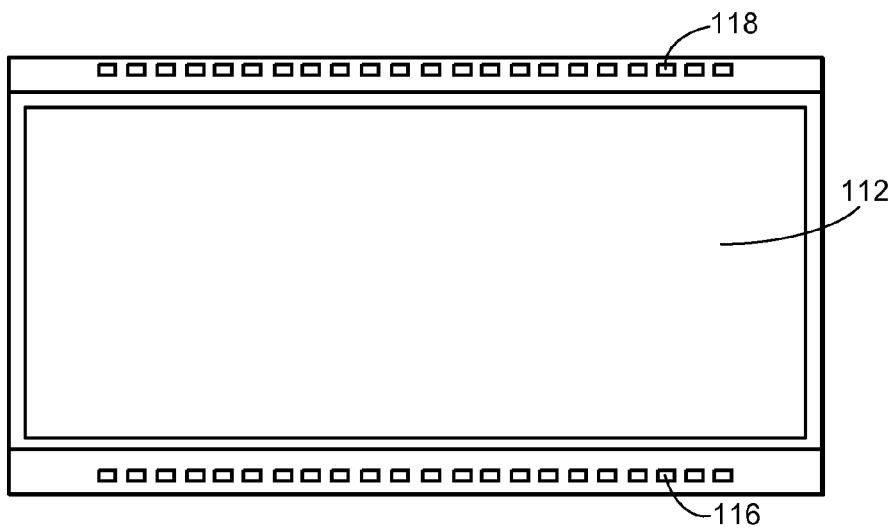
FIG. 3 is a bottom view of an integrated circuit package system, of FIGS. 1 and 2, in accordance with an embodiment of the present invention.

Referring now to FIG. 3, therein is shown a bottom view of the integrated circuit package system 100 and 200, of FIGS. 1 and 2, in accordance with an embodiment of the present invention. This view depicts the first device backside 112 located between the first lead-finger system 116 and the second lead-finger system 118. This type of package configuration is commonly referred to as a dual-in-line package and may include, but is not limited to, PDIP (Plastic Dual-In-line Packages), TSOP (Thin Small Outline Packages), SOP (Small Outline Packages), SOJ (Small Outline J-lead packages), and SSOP (Shrink Small Outline Package).

Figure 4:
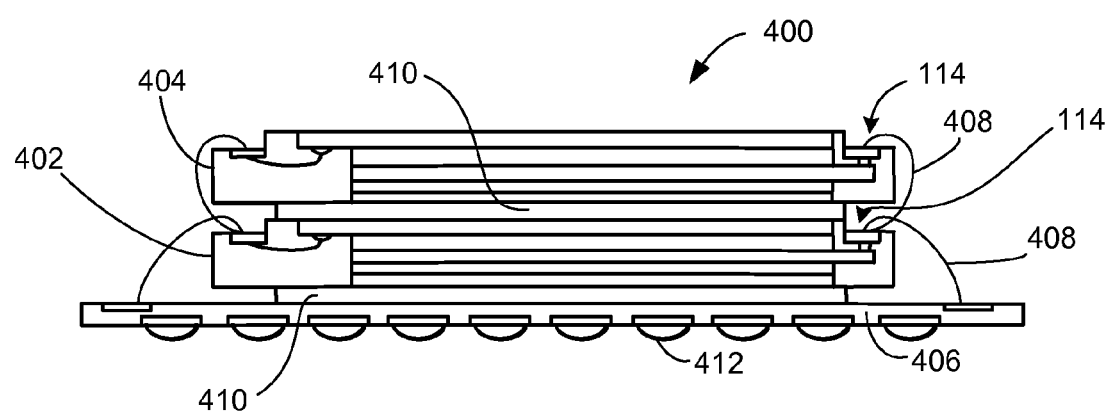
FIG. 4 is a cross-sectional view of an integrated circuit package-on-package system, in accordance with another embodiment of the present invention.

Referring now to FIG. 4, therein is shown a cross-sectional view of an integrated circuit package-on-package system 400, in accordance with another embodiment of the present invention. By way of example, the package-on-package design may include a three dimensional package that stacks a fully tested package, such as a stacked-die-package, on top of another device, such as an application-specific-integrated-circuit or a digital signal processor packaged on a substrate.

The integrated circuit package-on-package system 400 includes a first package 402 stacked below a second package 404. The first package 402 and the second package 404 may be similar to or substantially the same as the integrated circuit package system 100 or 200, of FIGS. 1 and 2.

The electrical interconnect system 114 of the first package 402 is electrically attached to a substrate 406, such as a printed circuit board, with an electrical connector 408. The electrical connector 408 may include a wire bond or a flexible tape, for example. The electrical connector 408 also electrically connects the electrical interconnect system 114 of the second package 404 to the first package 402.

An inter-package structure 410 is formed between the first package 402 and the substrate 406. The inter-package structure 410 may include an adhesive film, a spacer, an electromagnetic interference shield, a thermally conductive layer, or a combination thereof.

The substrate 406 may include external electrical contacts 412 for connecting the integrated circuit package-on-package system 400 to external electrical circuits. The substrate 406 may also serve as a system level heat sink for the integrated circuit package-on-package system 400.

The first package 402 and the second package 404 may be tested individually to ensure the use known good die/packages before the package-on-package assembly process. The integrated circuit package-on-package system 400 may also undergo further testing during and after assembly.

Although the present embodiment only depicts the first package 402 and the second package 404 stacked thereover, it is to be understood that the integrated circuit package-on-package system 400 includes any number of packages stacked one over the other. By way of example, multiple packages may be stacked one over the other to provide a high-density memory system for a memory card.

Furthermore, it has been discovered by the inventors that the symmetrical configuration of the integrated circuit package-on-package system 400 produces a package with less overall stress, thereby improving device reliability.

Figure 5:
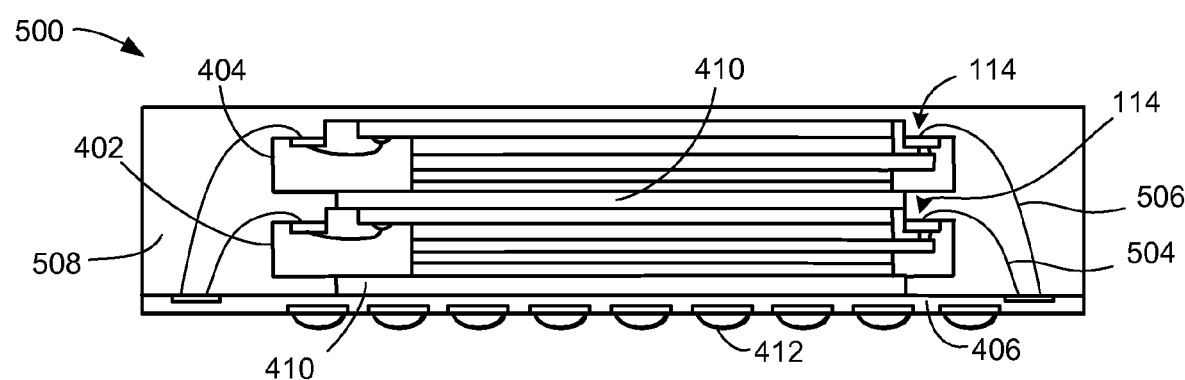
FIG. 5 is a cross-sectional view of an integrated circuit package-in-package system, in accordance with another embodiment of the present invention.

Referring now to FIG. 5, therein is shown a cross-sectional view of an integrated circuit package-in-package system 500, in accordance with another embodiment of the present invention. By way of example, the package-in-package design may include a three dimensional package system that stacks a fully tested Internal Stacking Module (ISM) on top of a Base Assemble Package (BAP) to form a single Chip Scale Package (CSP).

The integrated circuit package-in-package system 500 includes the first package 402 stacked below the second package 404. The first package 402 and the second package 404 may be similar to or substantially the same as the integrated circuit package system 100 or 200, of FIGS. 1 and 2.

The first package 402 is attached to the substrate 406, such as a printed circuit board, with the inter-package structure 410. The inter-package structure 410 may include an adhesive film, a spacer, an electromagnetic interference shield, a thermally conductive layer, or a combination thereof. The electrical interconnect system 114 of the first package 402 is connected to the substrate 406 with first interconnects 504, such as bond wires or a film adhesive on wire.

The second package 404 stacks over the first package 402 with the inter-package structure 410 formed in between. The electrical interconnect system 114 of the second package 404 is connected to the substrate 406 with second interconnects 506, such as bond wires or a film adhesive on wire.

The encapsulation material 508 covers the first package 402 and the second package 404, the inter-package structure 410, the first interconnects 504, and the second interconnects 506. The encapsulation material 508 may be any number of materials, such as an epoxy molding compound.

The substrate 406 may include the external electrical contacts 412 for connecting the integrated circuit package-in-package system 500 to external electrical circuits. The substrate 406 may also serve as a system level heat sink for the integrated circuit package-in-package system 500.

The first package 402 and the second package 404 may be tested individually to ensure the use known good die/packages before the package-in-package assembly process. The integrated circuit package-in-package system 500 may also undergo further testing during and after assembly.

Although the present embodiment only depicts the first package 402 and the second package 404 stacked thereover, it is to be understood that the integrated circuit package-in-package system 500 includes any number of packages stacked one over the other. By way of example, multiple packages may be stacked one over the other to provide a high-density memory system for a memory card.

Vertical integration of the integrated circuit package-in-package system 500 can be achieved by stacking the individual packages one over the other and interconnecting them with wire bonding at both sides of the substrate 406.

Furthermore, it has been discovered by the inventors that the symmetrical configuration of the integrated circuit package-in-package system 500 produces a package with less overall stress, thereby improving device reliability.

FIGS. 6-12 depict an exemplary process flow for the manufacture of the integrated circuit package system 200, of FIG. 2, in accordance with an embodiment of the present invention. It is to be understood that FIGS. 6-12 depict by way of example and not by limitation, an exemplary process flow for the formation of the integrated circuit package system 200, and it is not to be construed as limiting. Furthermore, the process steps depicted by FIGS. 6-12 are equally applicable to the integrated circuit package system 100, of FIG. 1.

Figure 6:
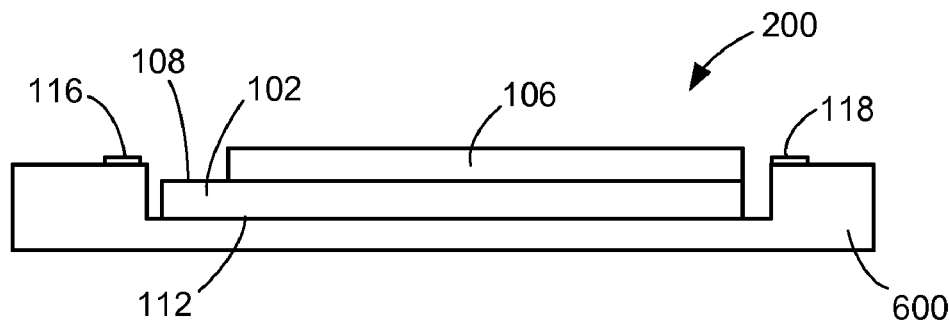
FIG. 6 is a cross-sectional view of the integrated circuit package system, of FIG. 2, in an initial stage of manufacture, in accordance with an embodiment of the present invention.

Referring now to FIG. 6, therein is shown a cross-sectional view of the integrated circuit package system 200, of FIG. 2, in an initial stage of manufacture, in accordance with an embodiment of the present invention. This cross-sectional view depicts attaching the first device backside 112 of the first device 102 to a recessed portion within a support medium 600. The first lead-finger system 116 and the second lead-finger system 118 are formed on the support medium 600.

By way of example, the support medium 600 may include a leadframe, a jig, an adhesive layer, or a combination thereof. However, it is to be understood that the support medium is not limited to these examples. In accordance with the invention, the support medium 600 may include any structure that helps to maintain the structural integrity of the integrated circuit package system 200 during processing.

The first inter-device structure 106 is formed over the first device active side 108.

Figure 7:
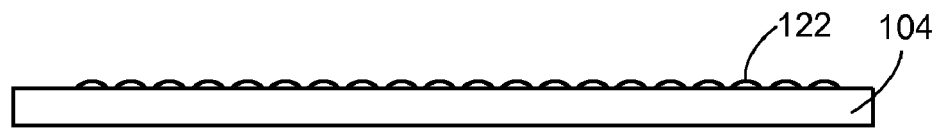
FIG. 7 is a side view of the second device after formation of the bump bond.

Referring now to FIG. 7, therein is shown a side view of the second device 104 after formation of the bump bond 122. The bump bonds 122 are formed along the periphery of the second device 104 and are strategically positioned to align with the second lead-finger system 118, of FIG. 6. By way of example, the bump bond 122 may include solder bumps, gold bumps and/or copper bumps.

Figure 8:
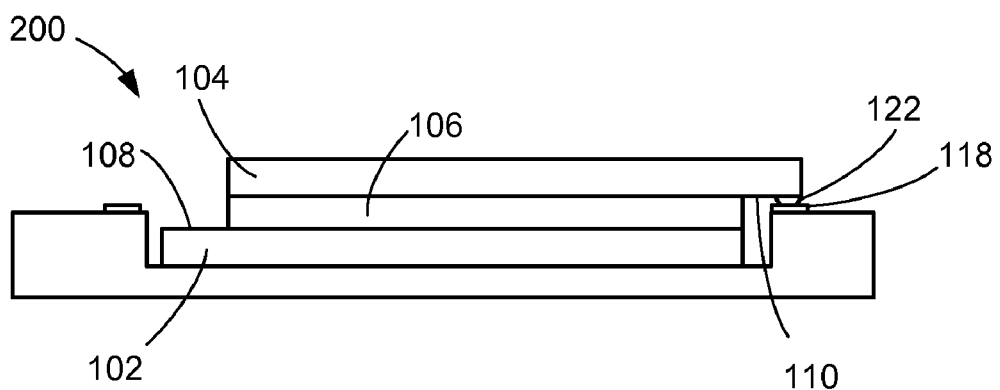
FIG. 8 is the structure of FIG. 6 after attachment of the second device over the first device.

Referring now to FIG. 8, therein is shown the structure of FIG. 6 after attachment of the second device 104 over the first device 102. This embodiment depicts the second device 104 formed over the first device 102 in an offset fashion with the first device active side 108 and the second device active side 110 separated by the first inter-device structure 106. The offset configuration of the second device 104 and the first device 102 exposes the bonding pads located on the first device active side 108 and the second device active side 110.

By offsetting the second device 104, the bonding pads located on the second device active side 110 overhang the second lead-finger system 118, which allows the second device 104 to be electrically connected to the second lead-finger system 118 by the bump bond 122. The bump bond 122 reduces the footprint area of the integrated circuit package system 200 by eliminating the minimum distance requirement of a wire bonding interconnection step.

Figure 9:
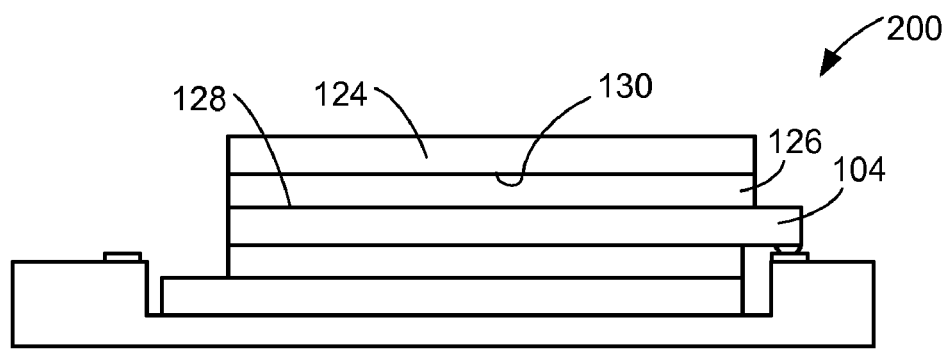
FIG. 9 is the structure of FIG. 8, after the formation of the dummy device and the second inter-device structure over the second device.

Referring now to FIG. 9, therein is shown the structure of FIG. 8, after the formation of the dummy device 124 and the second inter-device structure 126 over the second device 104. More specifically, the second inter-device structure 126 is formed between the second device backside 128 and the dummy device bottom side 130.

Notably, the present inventors have discovered that by attaching the dummy device 124 over the second device 104, the integrated circuit package system 200 is less susceptible to warping, delamination, and chip cracking problems that are often associated with thin profile packages.

Additionally, the well balanced configuration of the integrated circuit package system 200 in the vertical direction, as well as the horizontal direction, facilitates the handling of the package during processing steps.

Figure 10:
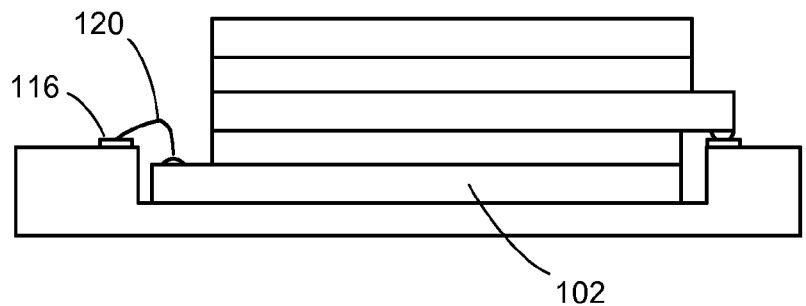
FIG. 10 is the structure of FIG. 9 after formation of the wire bond.

Referring now to FIG. 10, therein is shown the structure of FIG. 9 after formation of the wire bond 120. The wire bond 120 electrically connects the first device 102 to the first lead-finger system 116.

Figure 11:
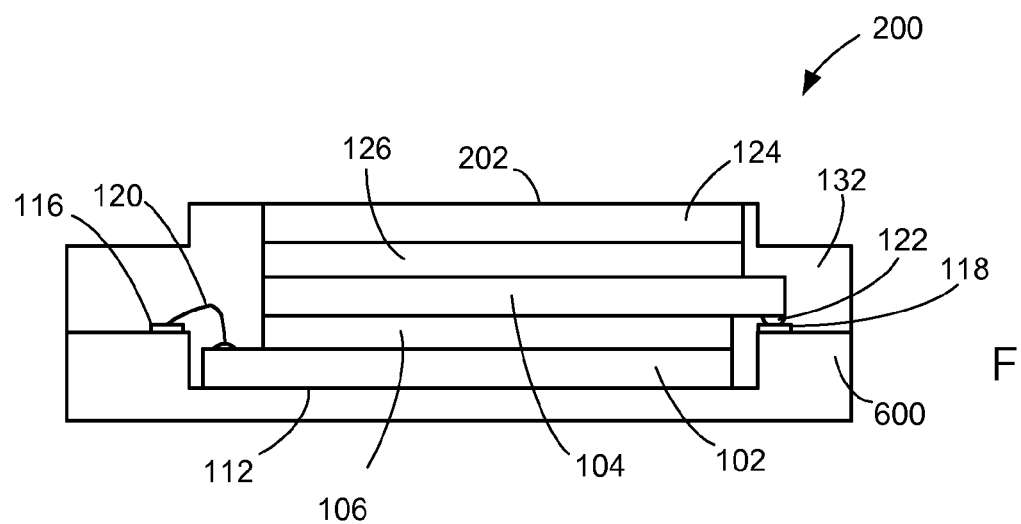
FIG. 11 is the structure of FIG. 10 after deposition of the encapsulation material.

Referring now to FIG. 11, therein is shown the structure of FIG. 10 after deposition of the encapsulation material 132. The first device 102, the second device 104, the first inter-device structure 106, the first lead-finger system 116, the second lead-finger system 118, the wire bond 120, the bump bond 122, the dummy device 124, and the second inter-device structure 126 are covered by the encapsulation material 132. This molding process can be designed such that the encapsulation material 132 does not cover the first device backside 112 and the dummy device top side 202. Additionally, a post mold cure can be performed to strengthen the encapsulation material 132. The support medium 600 stabilizes the integrated circuit package system 200 during these process steps.

Figure 12:
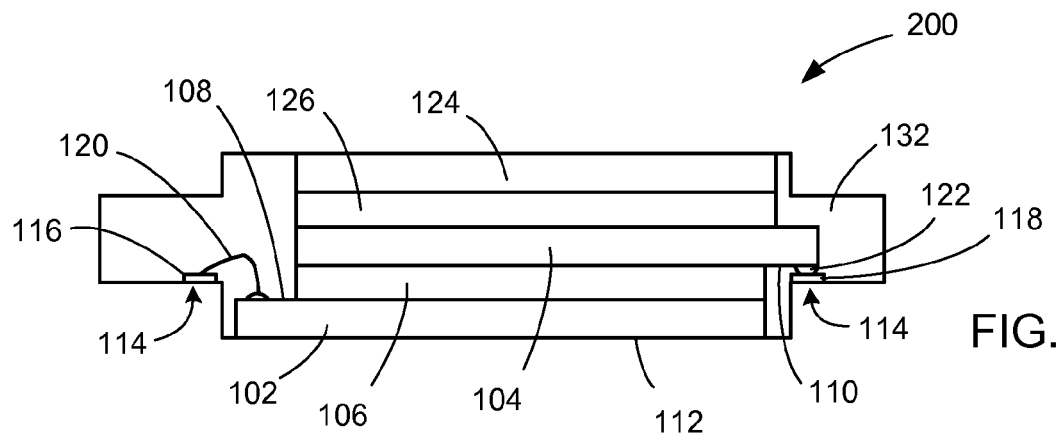
FIG. 12 is the structure of FIG. 11 after removal of the support structure, of FIG. 11.

Referring now to FIG. 12, therein is shown the structure of FIG. 11 after removal of the support medium 600, of FIG. 11. The integrated circuit package system 200 includes the first device 102, the second device 104, the first inter-device structure 106, the first device active side 108, the second device active side 110, the first device backside 112, the electrical interconnect system 114, the first lead-finger system 116, the second lead-finger system 118, the wire bond 120, the bump bond 122, the dummy device 124, the second inter-device structure 126, and the encapsulation material 132. During this portion of the manufacturing sequence, the support medium 600 is removed from the integrated circuit package system 200, thereby exposing the first device backside 112 and the bottom surfaces of the first lead-finger system 116 and the second lead-finger system 118. If desired, the first lead-finger system 116 and the second lead-finger system 118 may undergo an optional plating process for improved conductivity and bonding.

During removal of the support medium 600, the electrical interconnect system 114 can be separated, for example, from a leadframe strip by trimming off the tie-bars. After separation of the electrical interconnect system 114, each of the integrated circuit package system(s) 200 are then singulated. After singulation, each of the integrated circuit package system 200 will exhibit or possess the characteristics of singulation along its peripheral edges. The characteristics of singulation may include physical features, such as micro-abrasions, which are indicative of a lasing or mechanical dicing process.

Figure 13:
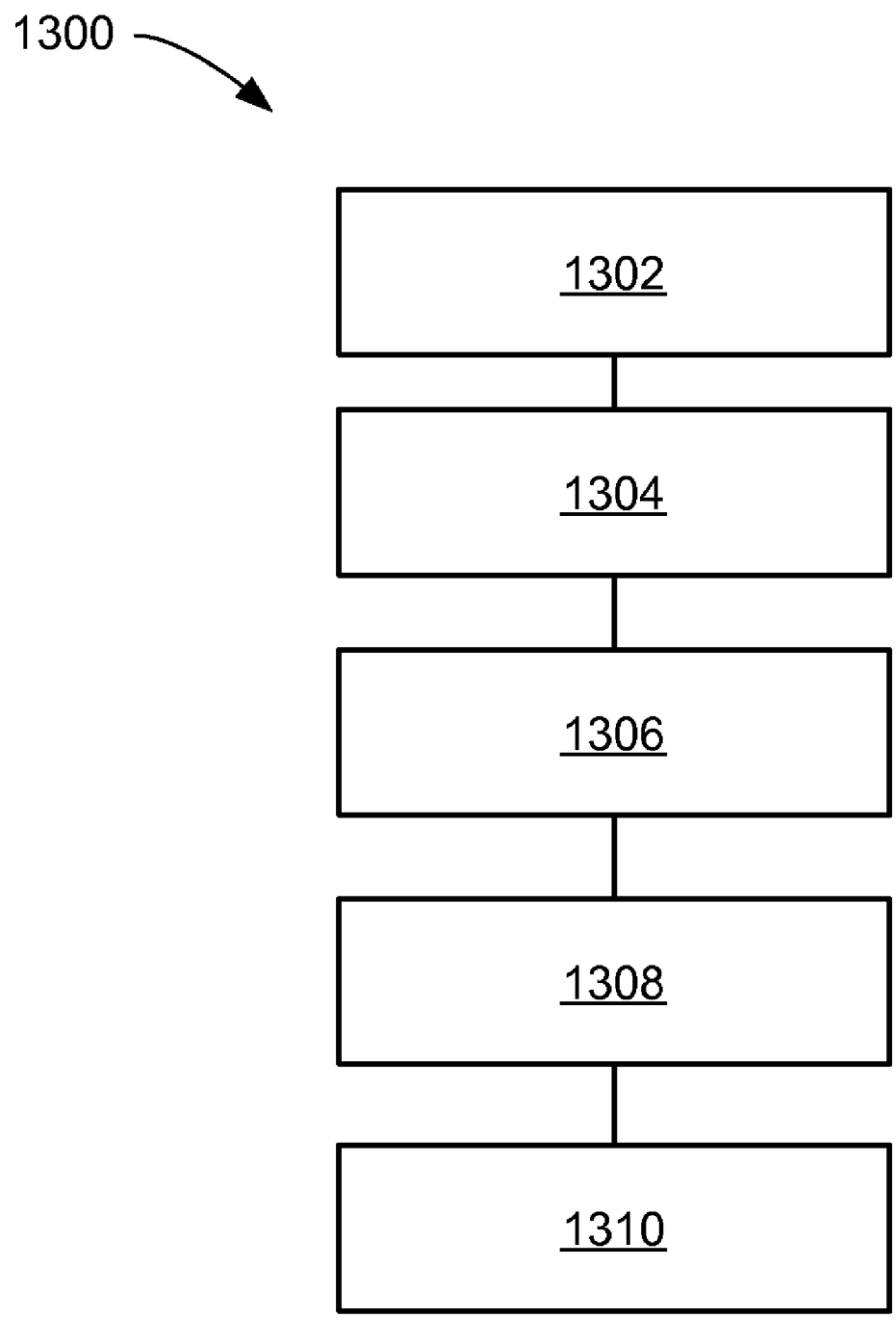
FIG. 13 is a flow chart of an integrated circuit package system for the integrated circuit package system, in accordance with an embodiment of the present invention.

Referring now to FIG. 13, therein is shown a flow chart of an integrated circuit package system 1300 for the integrated circuit package system 100 and 200, in accordance with an embodiment of the present invention. The integrated circuit package system 1300 includes providing an electrical interconnect system including a first lead-finger system and a second lead-finger system in a block 1302; stacking a second device over a first device between the first lead-finger system and the second lead-finger system in a block 1304; connecting the second device to the second lead-finger system with a bump bond in a block 1306; stacking a dummy device over the second device in a block 1308; and connecting the first device to the first lead-finger system with a wire bond in a block 1310.

It has been discovered that the present invention thus has numerous aspects. A principle aspect is that the present invention reduces the incidence of delamination, device cracking, and/or warpage of the first device, the second device and/or the integrated circuit package system, as a whole. By forming the dummy device over the second device, the dummy device can provide structural support to the integrated circuit package system, thereby helping to eliminate the undesirable effects of warpage.

Another aspect of the present invention is that it provides an integrated circuit package system possessing a reduced footprint area. By employing a combination of wire bond and bump bond technology, the present invention is able to reduce the footprint area of a device.

Another aspect of the present invention is that it provides a package design with enhanced thermal dissipation characteristics. By exposing a portion of a device to the external environment, the integrated circuit package system may more readily dissipate any heat generated by the devices within the package.

Another aspect of the present invention is that it provides a package design with a low height. By eliminating the use of a die paddle and by employing thin and ultra-thin devices, the height of the package can be reduced.

Another aspect of the present invention is that it provides an offset active side-to-active side stacking configuration that protects the circuitry of the active sides.

Yet another aspect of the present invention is that it provides the flexibility of stacking in different configurations, such as package-on-package and package-in-package configurations.

Yet another aspect of the present invention is that it provides a low cost solution to stacking of known good packages in a high density memory system with a low package profile.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for reducing the effects of undesirable warpage stresses and for reducing package footprint area. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing an electrical interconnect system including a first lead-finger system and a second lead-finger system;
   stacking a second device over a first device between the first lead-finger system and the second lead-finger system;
   connecting the second device to the second lead-finger system with a bump bond;
   stacking a dummy device over the second device; and
   connecting the first device to the first lead-finger system with a wire bond.

2. The method as claimed in claim 1 wherein:
   stacking the dummy device over the second device includes stacking an inactive semiconductor die/package, a spacer, an electromagnetic interference shield, a thermally conductive layer, or a combination thereof.

3. The method as claimed in claim 1 wherein:
   stacking the dummy device over the second device provides structural rigidity to the integrated circuit package system.

4. The method as claimed in claim 1 wherein:
   stacking the second device includes offsetting the second device to expose a portion of a first device active side and a second device active side.

5. The method as claimed in claim 1 further comprising:
   providing a first inter-device structure between the first device and the second device and a second inter-device structure between the second device and the dummy device.

6. A method of manufacture of an integrated circuit package system comprising:
   providing an electrical interconnect system and a first device attached to a support medium;
   stacking a second device over the first device;
   connecting the second device to a second lead-finger system of the electrical interconnect system with a bump bond;
   stacking a dummy device over the second device;
   connecting the first device to a first lead-finger system of the electrical interconnect system;
   depositing an encapsulation material; and
   removing the support medium.

7. The method as claimed in claim 6 wherein:
   stacking the second device over the first device allows the second lead-finger system to be placed underneath the second device.

8. The method as claimed in claim 6 further comprising:
   configuring the integrated circuit package system to be part of an integrated circuit package-on-package system.

9. The method as claimed in claim 6 further comprising:
   configuring the integrated circuit package system to be part of an integrated circuit package-in-package system.

10. The method as claimed in claim 6 further comprising:
    exposing a portion of a dummy device top side.

11. An integrated circuit package system comprising:
    an electrical interconnect system including a first lead-finger system and a second lead-finger system;
    a second device over a first device between the first lead-finger system and the second lead-finger system;
    a bump bond between the second device and the second lead-finger system;
    a dummy device over the second device; and
    a wire bond between the first device and the first lead-finger system.

12. The system as claimed in claim 11 wherein:
    the dummy device includes an inactive semiconductor die/package, a spacer, an electromagnetic interference shield, a thermally conductive layer, or a combination thereof.

13. The system as claimed in claim 11 wherein:
    the dummy device provides structural rigidity to the integrated circuit package system.

14. The system as claimed in claim 11 wherein:
    the second device is offset from the first device to expose a portion of a first device active side and a second device active side.

15. The system as claimed in claim 11 further comprising:
    a first inter-device structure between the first device and the second device and a second inter-device structure between the second device and the dummy device.

16. The system as claimed in claim 15 wherein:
    the first inter-device structure and the second inter-device structure may be selected from an adhesive with or without thermally conducting capabilities, a spacer, an electromagnetic interference shield, or a combination thereof.

17. The system as claimed in claim 11 wherein:
    the second lead-finger system is underneath the second device.

18. The system as claimed in claim 11 wherein:
    the integrated circuit package system is part of an integrated circuit package-on-package system.

19. The system as claimed in claim 11 wherein:
    the integrated circuit package system is part of an integrated circuit package-in-package system.

20. The system as claimed in claim 11 further comprising:
    a portion of a dummy device top side exposed.

* * * * *